(12) United States Patent
Ho et al.

(10) Patent No.: US 7,736,070 B2
(45) Date of Patent: Jun. 15, 2010

(54) DOUBLE MOLD OPTOCOUPLER

(75) Inventors: Soo Kiang Ho, Singapore (SG); Hong Sia Tan, Singapore (SG); Thiam Siew Gary Tay, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1071 days.

(21) Appl. No.: 11/216,863

(22) Filed: Aug. 31, 2005

(65) Prior Publication Data

US 2007/0045882 A1    Mar. 1, 2007

(51) Int. Cl.
G02B 6/36 (2006.01)
H01L 29/16 (2006.01)

(52) U.S. Cl. .............. 385/92; 385/88; 385/93; 385/94; 257/79; 257/80; 257/81; 257/82; 257/84; 257/98; 257/99; 257/100; 257/431; 257/432; 257/433; 257/444; 257/459

(58) Field of Classification Search ............ 385/92; 257/82, 100
See application file for complete search history.

(56) References Cited

U.S. PATENT DOCUMENTS

| | | | | |
|---|---|---|---|---|
| 4,058,821 A | * | 11/1977 | Miyoshi et al. | 257/82 |
| 4,109,269 A | * | 8/1978 | Hatch | 257/82 |
| 4,811,081 A | * | 3/1989 | Lyden | 257/668 |
| 5,245,198 A | * | 9/1993 | Kusuda et al. | 250/551 |
| 5,545,893 A | | 8/1996 | Brown et al. | |
| 5,647,034 A | * | 7/1997 | Matsuda et al. | 385/16 |
| 6,285,084 B1 | | 9/2001 | Hikita et al. | |
| 6,696,704 B1 | * | 2/2004 | Maeda et al. | 257/98 |
| 6,861,675 B2 | * | 3/2005 | Tomioka et al. | 257/82 |
| 7,170,099 B2 | * | 1/2007 | Noguchi | 257/82 |
| 7,307,285 B2 | * | 12/2007 | Noguchi | 257/82 |
| 2002/0190262 A1 | * | 12/2002 | Nitta et al. | 257/99 |
| 2004/0149995 A1 | * | 8/2004 | Shoji et al. | 257/81 |
| 2005/0023441 A1 | * | 2/2005 | Inoue et al. | 250/214.1 |

FOREIGN PATENT DOCUMENTS

WO    WO 02/061853 A1    8/2002

* cited by examiner

Primary Examiner—Ryan Lepisto

(57) ABSTRACT

Double mold opto-coupler and method for manufacture. A first subassembly is formed that includes a light detector. The first subassembly is molded with a first mold material to form a molded first subassembly. A light source is attached to the molded first sub-assembly to form a second sub-assembly. The second sub-assembly is molded with a second mold material to form a final assembly with predetermined dimensions.

8 Claims, 5 Drawing Sheets

DOUBLE MOLD OPTOCOUPLER

BACKGROUND OF THE INVENTION

Light emitting diodes (LEDs) have many useful commercial applications. Because they are monochromatic, LED lights have great power advantages over white lights especially in applications in which a specific color light is needed. Unlike the white lights, the LED does not need a color filter that absorbs most of the emitted white light. Since LED lights are inherently colored and are available in a wide range of colors, LEDs have become of choice in many lighting applications.

One application for LEDs is in opto isolation products, such as opto couplers. The assignee of the present patent application is a manufacture of such opto isolation products. Examples of these opto-isolation products are described at the following Internet address, www.agilent.com.

An opto-coupler includes both a photo detector and a light emitting diode that are separately manufactured on separate integrated circuit or die. Accordingly, one step in manufacturing opto-couplers is the combining of the photo detector IC and the LED IC. Currently, an isolation tape with epoxy on both sides thereof is utilized to attach the LED to the photo detector IC.

Unfortunately, this process for combining the photo detector IC and the LED IC suffers from several drawbacks or disadvantages. First, the application of the epoxy on the isolation tape has very tight process constraints. For example, any excessive epoxy flowing towards the wire bond pad increases the likelihood of difficulty in subsequent wire bonding processing steps. The application of the epoxy is further complicated by the very small amount of clear epoxy that needs to be dispensed.

Second, and perhaps more detrimental, the placement of the isolation tape is critical to the success of the product. For example, misalignment of the isolation tape can result in poor isolation. Third, the optical transmittance of the isolation tape reduces the coupling efficiency of the opto-coupler.

Based on the foregoing, there remains an opto-coupler and method for manufacturing the same that overcomes the disadvantages set forth previously.

SUMMARY OF THE INVENTION

According to one embodiment of the present invention, a double mold opto-coupler apparatus and method for manufacture are described. A first subassembly is formed that includes that includes a light detector. The first subassembly is molded with a first mold material to form a molded first subassembly. A light source is attached to the molded first sub-assembly to form a second sub-assembly. The second sub-assembly is molded with a second mold material to form a final assembly with predetermined dimensions.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Double mold opto coupler and method for manufacture is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Double Mold Opto Coupler 100

Figure 1:
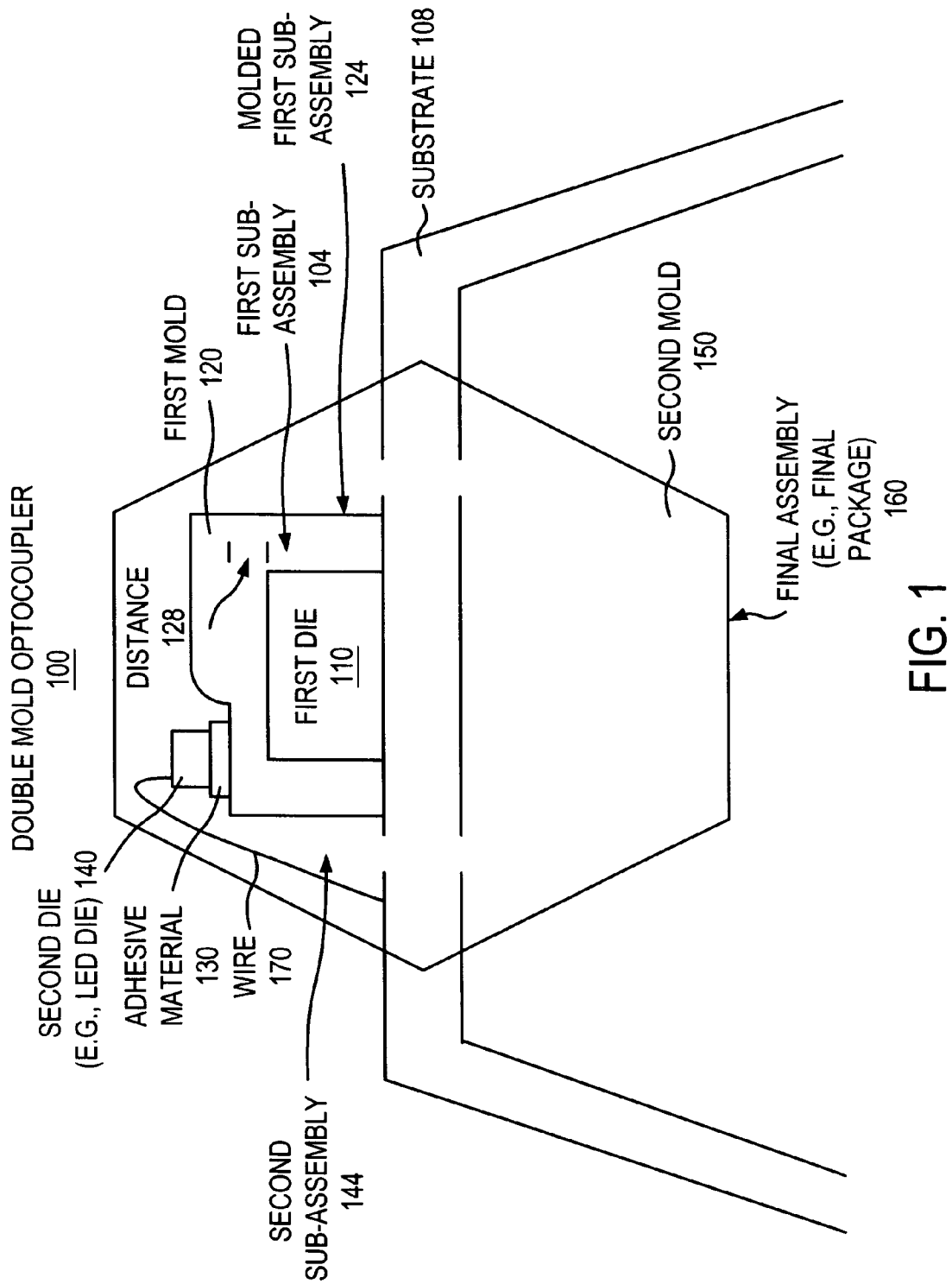
FIG. 1 illustrates a double mold opto coupler according to one embodiment of the invention.

FIG. 1 illustrates a double mold opto coupler 100 according to one embodiment of the invention. The double mold opto coupler 100 includes a substrate 108, a first integrated circuit or die 110, a second integrated circuit or die 140, an adhesive material (e.g., an adhesive layer) 130, a first mold 120 and a second mold 150. In one embodiment, the first integrated circuit 110 is a light detector (e.g., a photo diode die or integrated circuit), and the second integrated circuit or die 140 is a light source 140 (e.g., a light emitting diode (LED) die or integrated circuit). The first mold 120 is made from a first mold material, and the second mold 150 is made from a second mold material.

The double mold opto coupler 100 includes a first sub-assembly 104. In one embodiment, the first sub-assembly 104 includes the light detector die 110, one or more conductors or wires (not shown), and a portion of the substrate 108. The conductors are added to wire bond the photo detector die to the substrate 108.

The first sub-assembly 104 is molded or cast with a first mold material 120 to form a molded first sub-assembly 124. The light source 140 is attached to the molded first sub-assembly 124 by an adhesive or epoxy 130 (e.g., a clear adhesive or epoxy) to form a second sub-assembly 144. One or more conductors or wires may be added to wire bond the light source 140 to the substrate 108. The second sub-assembly 144 is then molded or cast with a second mold material 150 to form a final assembly 160 with predetermined dimensions.

The adhesive material 130 can be, but is not limited to, an epoxy, a clear epoxy, an adhesive, a clear adhesive, other material suitable for attaching a die or integrated circuit to a sub-assembly. The first mold material 120 can be, but is not limited to, a single material, a compound, a clear material, a plastic material, a clear plastic material, a thermo set plastic material, and a clear thermoset plastic material. One purpose of the first mold 120 is to provide a light path from the light source 140 to the first die 110. In this regard, the first mold 120 can be made from any material that supports this purpose.

The second mold material 150 can be, but is not limited to, a single material, a compound, an opaque material, a plastic material, an opaque plastic material, a thermo set plastic material, and an opaque thermoset plastic material. One purpose of the second mold 150 is to prevent the light from the light source 140 from escaping to the environment or to prevent ambient light from entering the first die 110. In this regard, the second mold 150 can be made from any material that supports this purpose. In one embodiment, the first mold material is a generally clear material, whereas the second mold material is a generally opaque material.

Method of Manufacture

Figure 2:
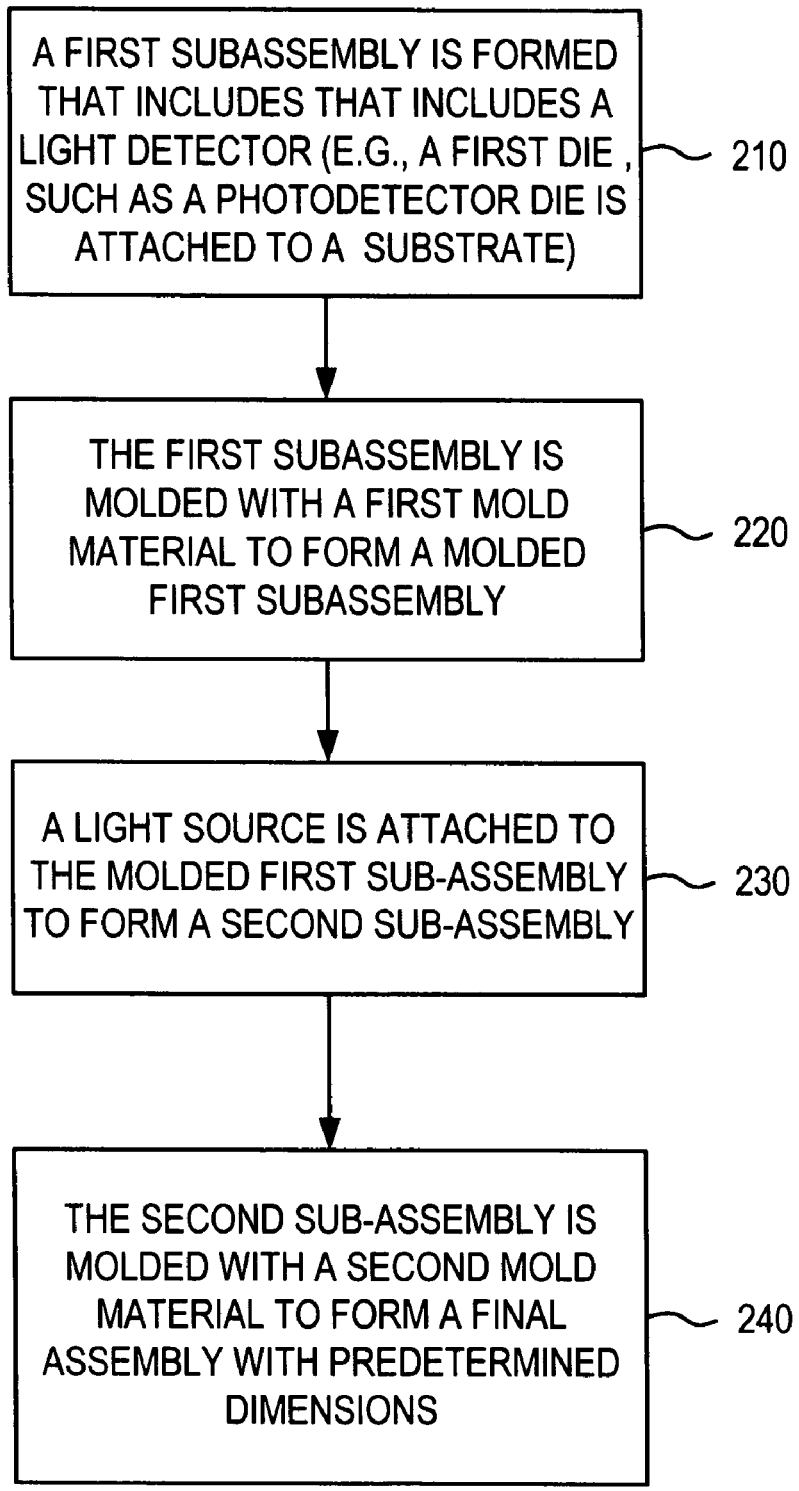
FIG. 2 is a flowchart illustrating a method for manufacturing an opto coupler according to a one embodiment of the invention.
Figure 3:
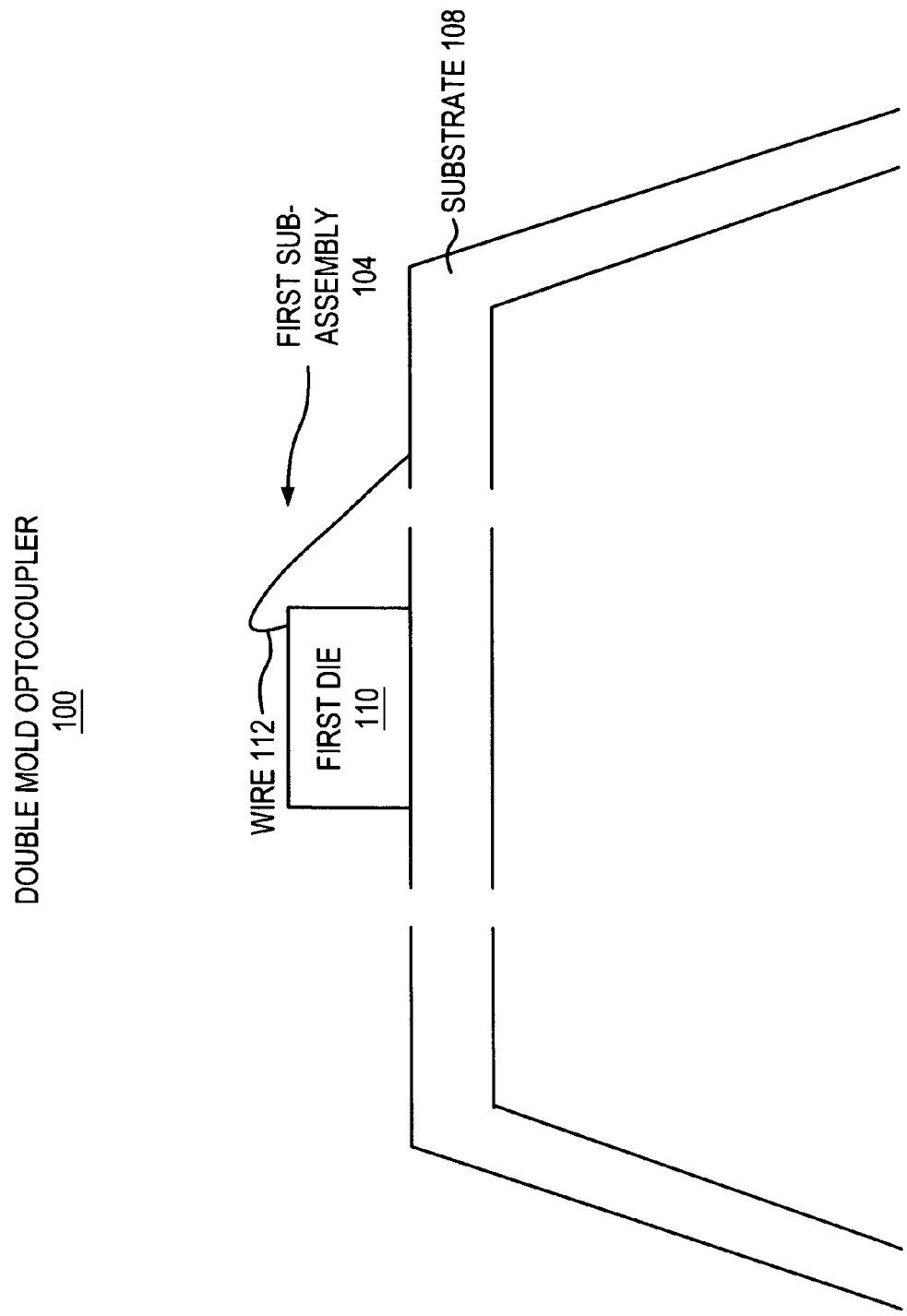
FIG. 3 illustrates a side view of the opto coupler after processing step 210 according to one embodiment of the invention.

FIG. 2 is a flowchart illustrating a method for manufacturing an opto coupler according to a one embodiment of the invention. In step 210, a first subassembly is manufactured or formed that includes that includes a light detector. For example, a first die, such as a photo detector die, is attached to a substrate. The first die may be electrically coupled to the substrate 108 through one or more conductors (e.g., wires) 112. For example, the photo detector integrated circuit may be wire bonded to the substrate 108 by utilizing one or more conductors 112 in step 210. FIG. 3 illustrates a side view of the opto coupler after processing step 210 according to one embodiment of the invention.

Figure 4:
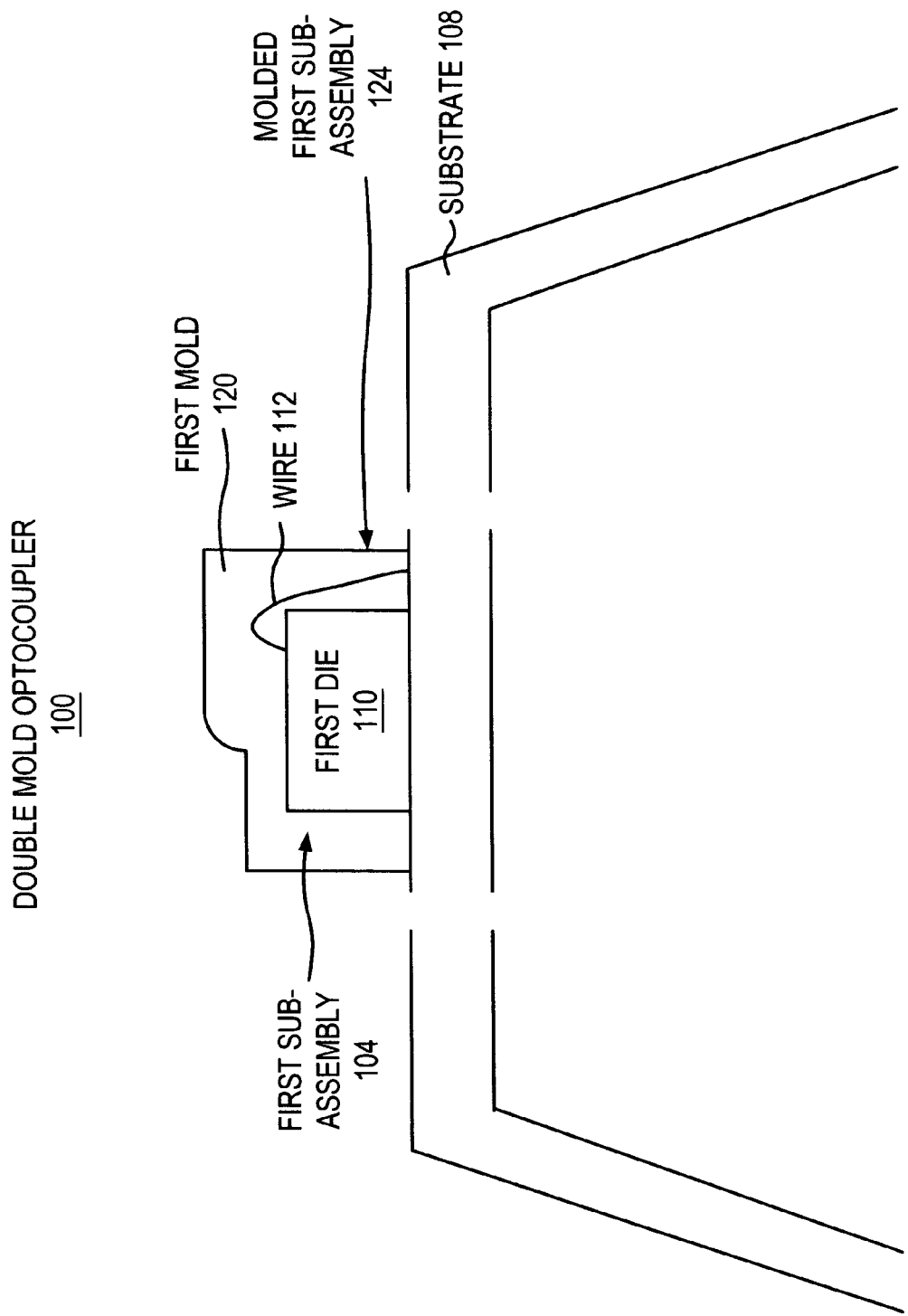
FIG. 4 illustrates a side view of the opto coupler after processing step 220 according to one embodiment of the invention.

In step 220, the first subassembly is molded with a first mold material to form a molded first subassembly. In one embodiment, the first sub-assembly is cast or molded with a first molding material (e.g., a clear epoxy). It is noted that the distance 128 between the top surface of the first die 110 and the bottom surface of the adhesive material 130 (referred to herein as "thickness") is important since this distance affects the overall isolation performance and coupling efficiency of the assembly. This thickness 128 is determined by one or more design factors that includes, but are not limited to, the isolation requirement required by the package with the dielectric strength of the selected epoxy. The cavity depth on the mold/cast die set is determined by this thickness 128 and the die thickness (e.g., the sum of the die thickness and the "thickness"). During the mold or cast process, care should be taken to avoid scratching the surface of this integrated circuit sub-assembly. The location of where the die set clamps onto the lead frame may be utilized as a reference guide. The subassembly is preferably heat-treated. FIG. 4 illustrates a side view of the opto coupler after processing step 220 according to one embodiment of the invention.

In step 230, a light source is attached to the molded first sub-assembly to form a second sub-assembly. For example, a light emitting diode (LED) is attached to the molded first sub-assembly to form a second sub-assembly. In one embodiment, the light emitting diode (LED) is attached on the molded first sub-assembly by using a clear adhesive.

Figure 5:
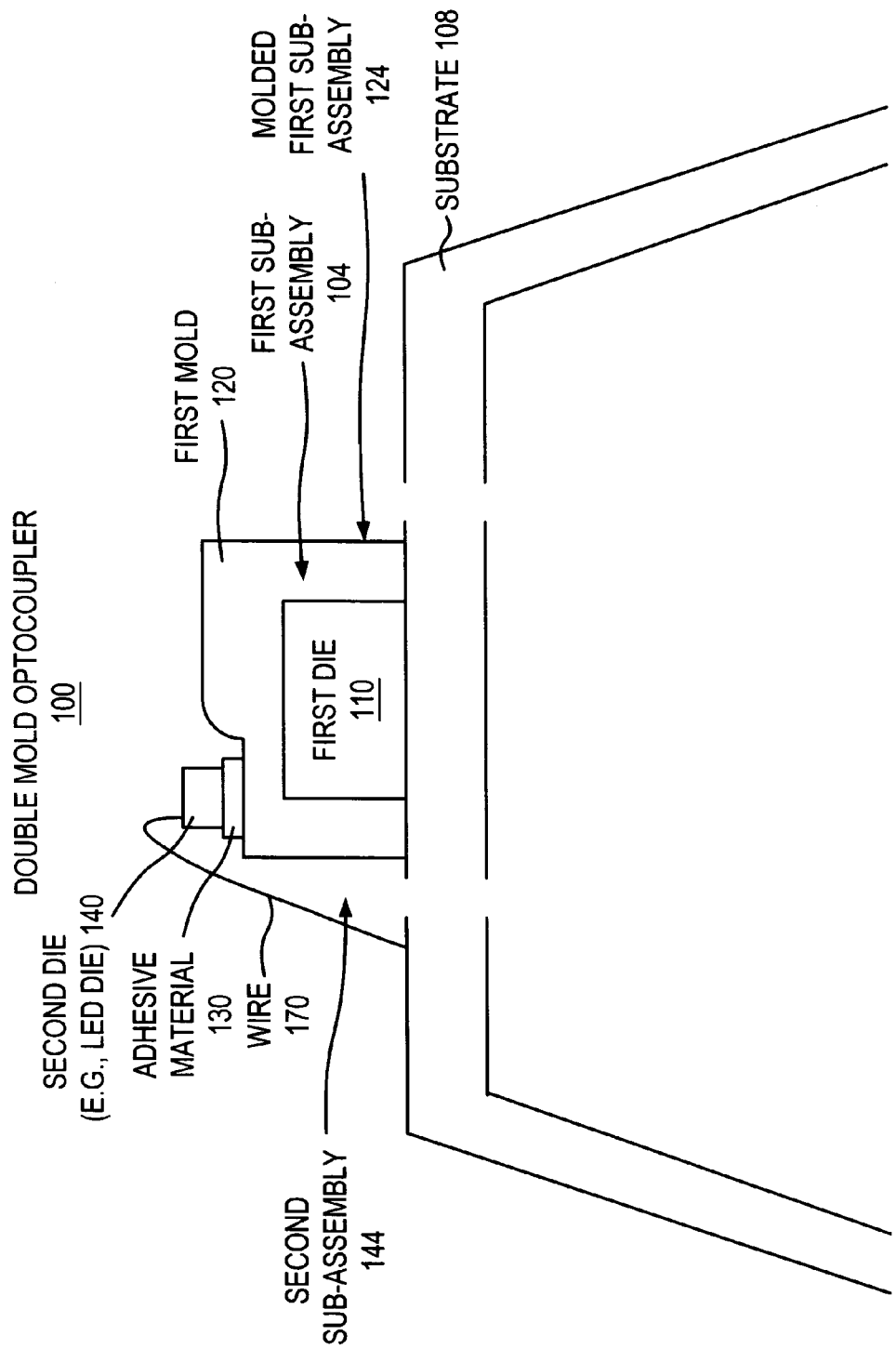
FIG. 5 illustrates a side view of the opto coupler after processing step 230 according to one embodiment of the invention.

Step 230 can also include bonding one or more conductors 170 (e.g., wires) to the light emitting diode. This bonding can be, for example, performed by utilizing ultrasonic bonding methods. In one embodiment, the second die 140 is electrically coupled to the substrate 108 through one or more conductors (e.g., wires) 170. For example, the light emitting diode integrated circuit may be wire bonded to the substrate 108 by utilizing one or more conductors 170 in step 230. FIG. 5 illustrates a side view of the opto coupler after processing step 230 according to one embodiment of the invention.

In step 240, the second sub-assembly is molded with a second mold material to form a final assembly with predetermined dimensions. The second mold material can be the same as or different from the first mold material. FIG. 1 illustrates a side view of the opto coupler after processing step 240 according to one embodiment of the invention.

The double mold opto-coupler and the method of manufacture according to the invention obviate the need for the use of isolation tape and the undesirable effects stemming therefrom.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. An opto-coupler comprising:
a first mold comprising an optically transparent material that encloses a first assembly comprising a first die mounted on a substrate, the first mold characterized by a pre-determined thickness between a first surface of the first die and a platform that is located on a first portion of an external surface of the first mold, the pre-determined thickness defined in part by a desired optical isolation performance of the opto-coupler and by an optical coupling efficiency of the optically transparent material, the first mold further characterized by a second portion of said external surface, the second portion configured to be at a different level with reference to the first portion;
an adhesive material disposed on the first portion of the external surface of the first mold; and
a second assembly comprising a second die that is affixed by the adhesive material to the platform located on the first portion of the external surface of the first mold.

2. The opto-coupler of claim 1, wherein the optically transparent material is an epoxy, and wherein the pre-determined thickness is further defined by a dielectric strength of the epoxy.

3. The opto-coupler of claim 1, wherein:
the first assembly further comprises a first bonding wire that is attached to the first die, the first bonding wire confined inside the optically transparent material; and
the second assembly further comprises a second bonding wire that is attached to the second die, the second bonding wire confined inside the opaque material.

4. The opto-coupler of claim 1, wherein the first die is one of a light emitter or a light detector, and the second die is a corresponding light detector or a corresponding light emitter respectively.

5. An opto-coupler comprising:
a first die having a bottom surface mounted on a substrate;
a second die; and
an optically transparent material encasing all the remaining surfaces of the first die, the optically transparent material having a first portion of an external surface configured as a die-mounting platform having a height that is different than that of a second portion of said external surface, the die-mounting platform separated from one of a) a light emitting surface or b) a light receiving surface of the first die, by a pre-determined thickness that is defined in part by a desired optical isolation performance of the opto-coupler and by an optical coupling efficiency between the first die and the second die, which is mounted on the die-mounting platform.

6. The opto-coupler of claim 5, wherein the first die is one of a light emitter having said light emitting surface, or a light detector having said light receiving surface.

7. The opto-coupler of claim 5, wherein the opto-coupler further comprises:
an opaque material enclosing the second die;
a first bonding wire that is attached to the first die, the first bonding wire confined inside the optically transparent material; and a second bonding wire that is attached to the second die, the second bonding wire confined inside the opaque material and located outside the optically transparent material.

8. The opto-coupler of claim 5, wherein the opto-coupler further comprises:

an adhesive material disposed on the die-mounting platform for affixing the second die to the optically transparent material.

* * * * *